United States Patent [19]

Hallford et al.

[11] 4,240,052

[45] Dec. 16, 1980

[54] BALUN FILTER APPARATUS

[75] Inventors: Ben R. Hallford, Wylie; Bruce C. Lutz, Richardson, both of Tex.

[73] Assignee: Rockwell International Corporation, El Segundo, Calif.

[21] Appl. No.: 84,287

[22] Filed: Oct. 12, 1979

[51] Int. Cl.³ .................... H01P 1/203; H01P 5/10; H03H 7/42; H03H 7/09
[52] U.S. Cl. ................................ 333/202; 333/26; 333/177; 333/204; 333/246
[58] Field of Search ................ 333/27, 33, 25, 26, 333/177–178, 238, 202, 204, 205, 208, 206, 207; 455/124, 286, 302, 325–327, 339

[56] References Cited

U.S. PATENT DOCUMENTS

| | | | |
|---|---|---|---|
| 3,818,385 | 6/1974 | Mouw | 333/26 |
| 3,835,421 | 9/1974 | DeBrecht et al. | 333/246 X |
| 3,846,721 | 11/1974 | Fritz et al. | 333/238 |
| 3,913,037 | 10/1975 | Himino et al. | 455/326 |
| 4,186,352 | 1/1980 | Hallford | 333/26 |

Primary Examiner—Marvin L. Nussbaum
Attorney, Agent, or Firm—Bruce C. Lutz; Howard R. Greenberg; H. Frederick Hamann

[57] ABSTRACT

The present invention uses two interconnected baluns with the balanced output of one feeding a balanced input of the other. When this filter is used in conjunction with a signal frequency converter, the balun pair not only provides extremely effective bandpass filtering so as to pass the RF frequencies and not the IF frequencies but, in addition, provides a condition which appears to the IF as a nearly open circuit and thus provides a large amount of reflection or return of the IF signals to the signal converter. Through the use of additional grounding stubs, additional coupling means, increased separation between coupling means and separated ground planes each singularly or in combination, improved performance has been obtained as compared to the prior art.

12 Claims, 7 Drawing Figures

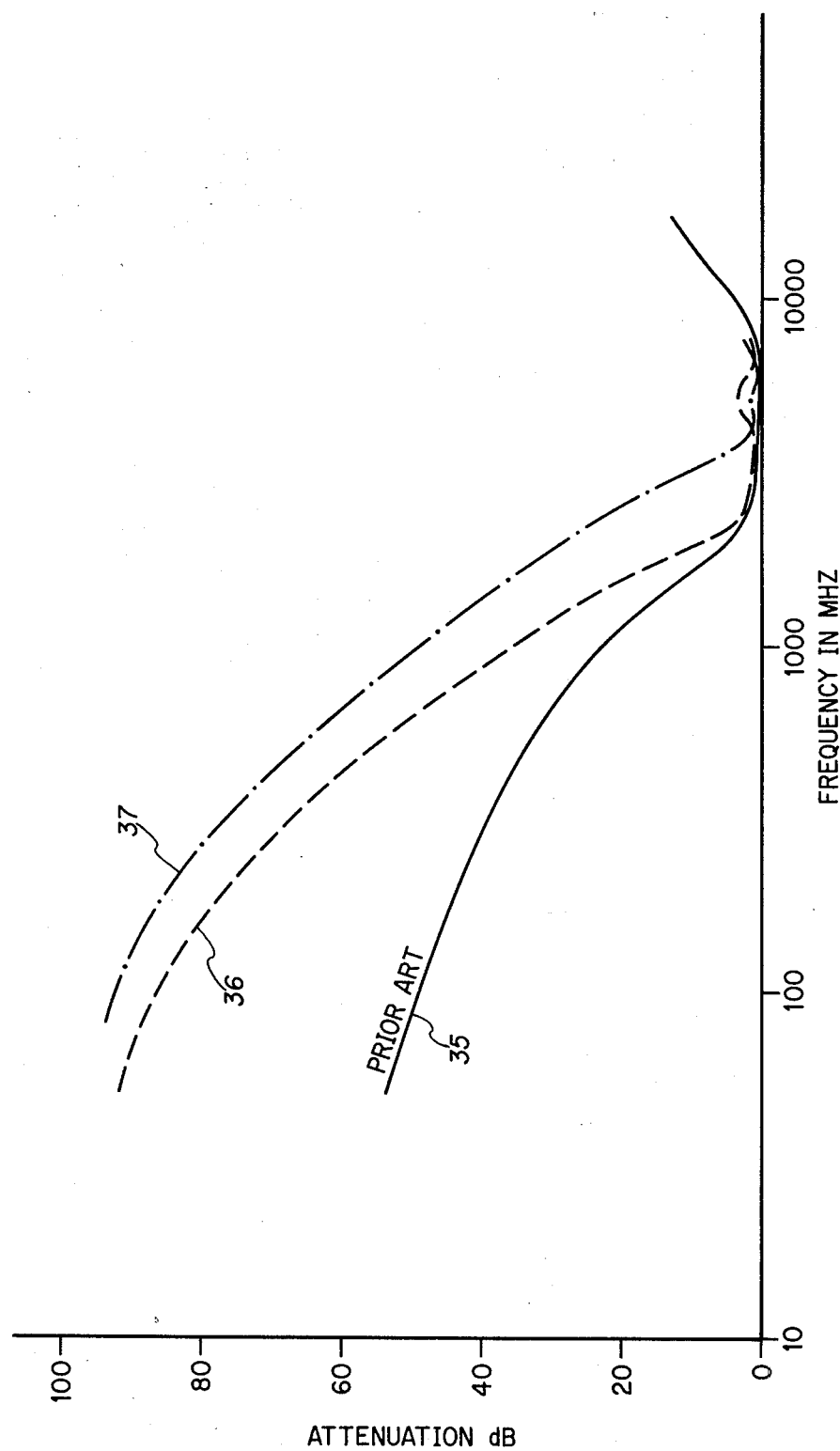

1

BALUN FILTER APPARATUS

THE INVENTION

The present invention is generally concerned with electronics and more specifically concerned with signal isolation and/or bandpass filtering.

When designing mixers or signal converters for use at any frequency and especially for use in conjunction with radio frequencies in the low GHz range, it is desirable to prevent a loss of IF signal frequencies used in the converter. The term "mixer" as used herein includes all frequency translators or converters whether they use sum or difference frequency products in the output.

The need always exists to separate an IF frequency signal from RF frequency signals at some point in the converter with a minimum of disturbance. The present inventive concept was constructed to separate IF signals in the approximately 100 MHz range from RF frequencies in the 5 GHz range. A series capacitor in the microstrip line is a usual prior art method employed, but this does not provide a high value of isolation unless the IF and RF signals are widely separated in frequency. In communication systems, the leakage of modulated IF signals from a mixer into adjoining circuits may cause the IF signal to be eventually reflected back to the mixer with a phase delay which causes a level of echo distortion that depends on the delay and magnitude of the returned IF signal. When such IF signals are allowed to escape from the signal converter proper, they are effectively lost and the efficiency of the signal converter is reduced.

It has been found that three grounded quarter-wavelength stubs spaced at quarter-wavelength spans at the RF frequency on a line between an RF signal generator and a signal converter provide fairly good IF bandpass filtering. However, such a grounded stub configuration effectively shorts all applied IF signals to ground and thus provides for very low efficiency of the signal converter.

Another device for attenuating IF frequency signals is presented in a co-pending application Ser. No. 084,286 filed on the same day as the present application and assigned to the same assignee as the present invention. This co-pending application utilizes a pair of baluns which are connected in series and which not only provide effective attenuation of IF signals from passing input to output, but in addition it appears to be apparently an open circuit to the IF frequency signals and thus raises the efficiency of connected signal converters.

This co-pending embodiment is illustrated herein under the label "Prior Art." The present invention produces signal bandpass characteristics significantly better than does the co-pending application due to a more complete understanding of the invention and its inventive concepts obtained over a period of testing and analysis.

The present invention presents concepts allowing complete electrical isolation including ground isolation between input and output as well as providing details on implementations which may be utilized to adjust bandpass characteristics and signal rejection characteristics to suit almost any desired need.

A common prior art approach to signal isolation has been to use a small capacitor in series between the signal converter and an RF generator. Such a device provides bandpass characteristics with an attenuation of less than 1 dB GHz while having a signal rejection of 25 dB at 70 MHz. The referenced co-pending application altered these characteristics to 52 dB signal rejections at 70 MHz while maintaining less than 1 dB at 5 GHz. One embodiment of the present invention using the techniques disclosed herein provided signal rejection at 70 MHz of 94 dB with the attenuation at the bandpass being approximately 1 dB or less at 6 GHz. It can thus be determined that while the attenuation at the bandpass increased $\frac{1}{2}$ dB or less, the signal rejection over the co-pending application for 70 MHz increased by sixteen thousand times and increased over the series capacitor prior art embodiment by eight million times.

In accordance with the above comments, it is believed apparent that an object of the present invention is to provide improved signal filtering and signal isolation apparatus.

Other objects and advantages of the present invention will be apparent from a reading of the specification and appended claims in conjunction with the drawings wherein:

Figure 3:
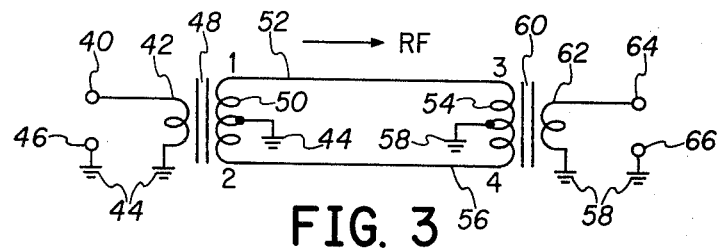
Figure 2:
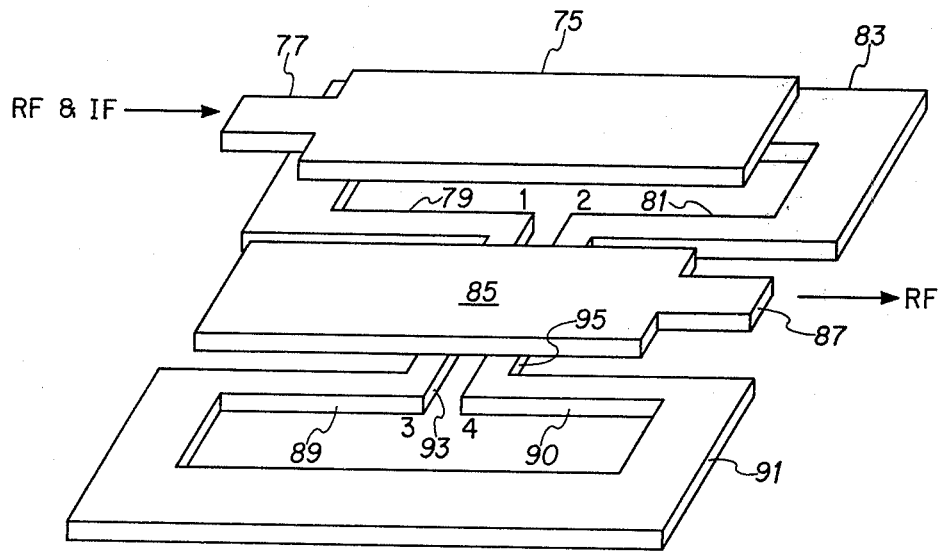
FIG. 2 illustrates an embodiment of the inventive concept.
Figure 5:
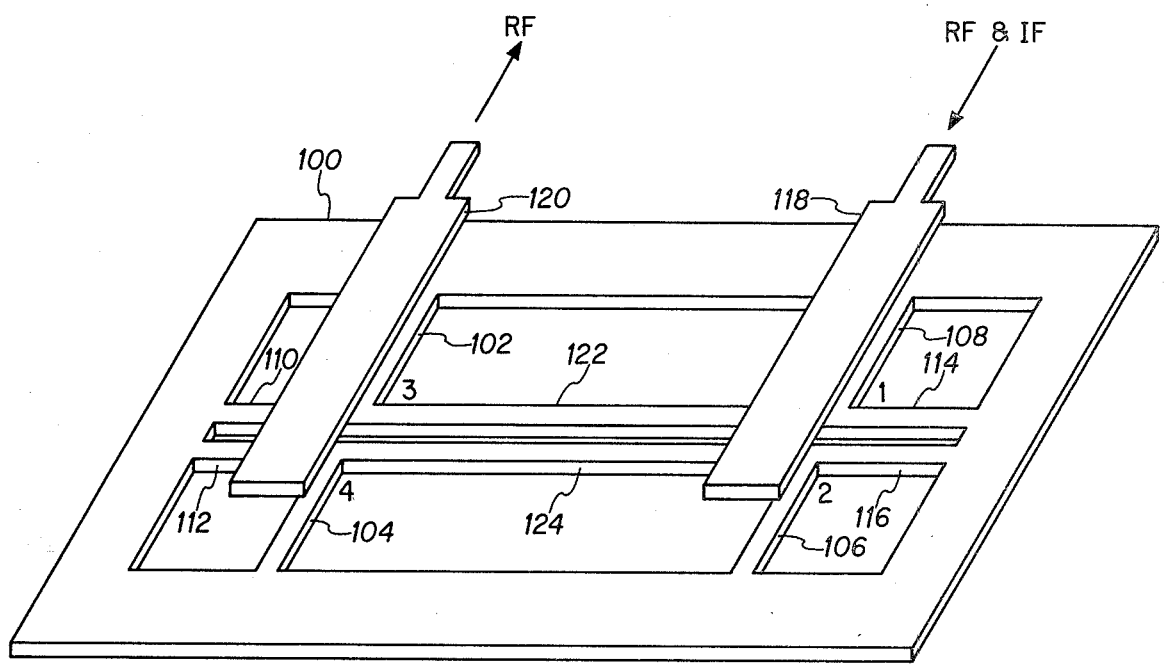
Figure 6:
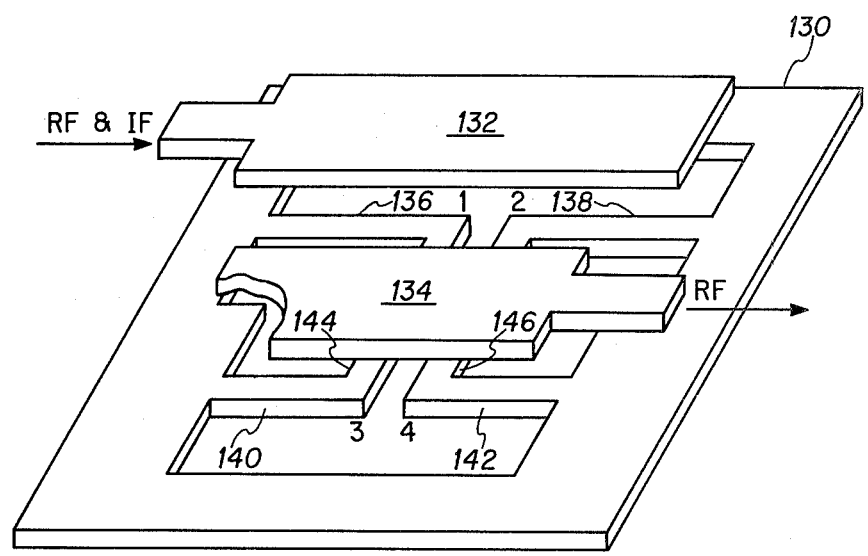
Figure 7:
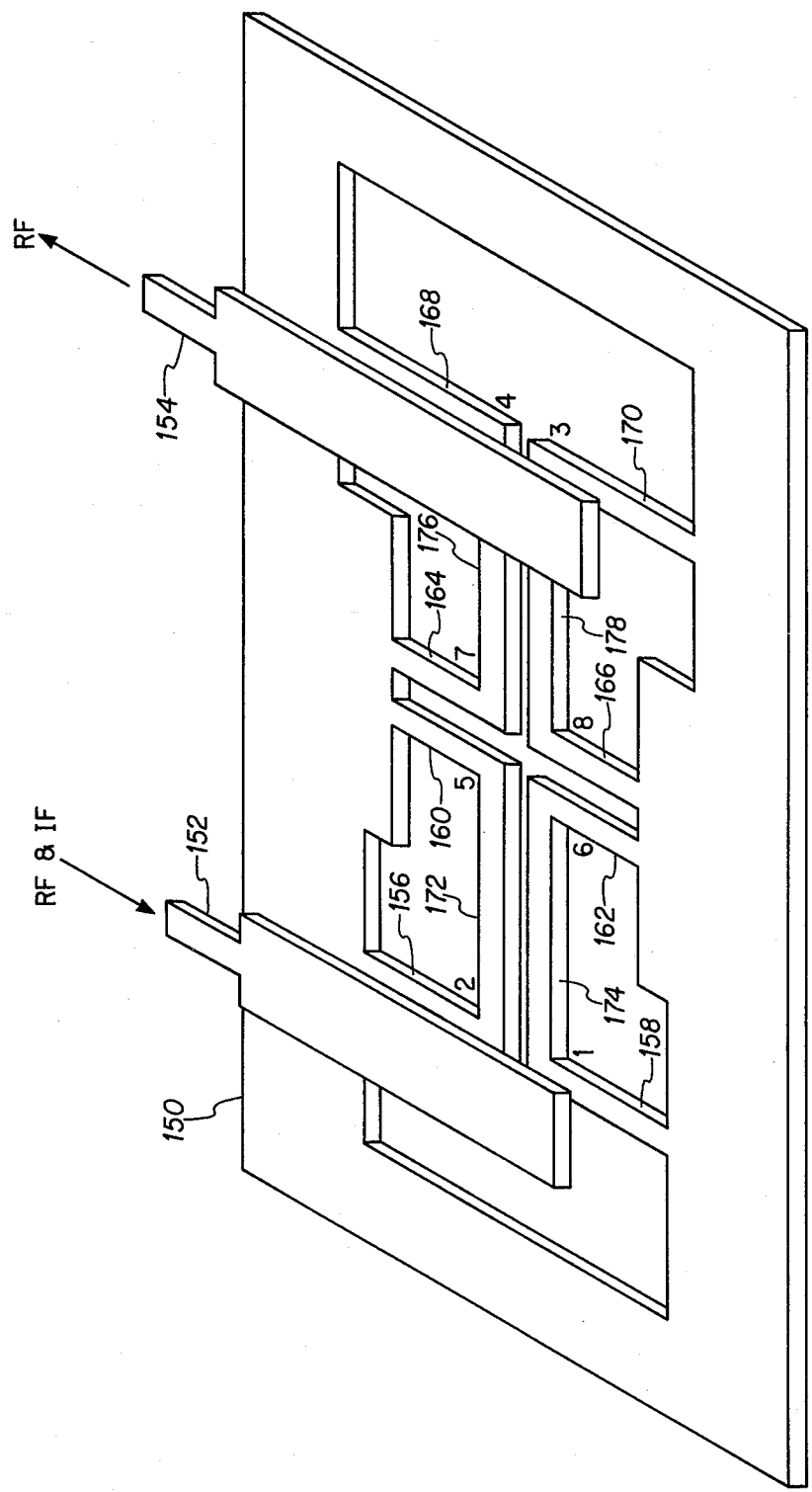

FIG. 3 comprises an equivalent circuit representation of FIG. 2;

FIG. 4 comprises a set of attenuation waveforms illustrating the attenuation versus frequency;

FIG. 5 illustrates an embodiment of the inventive concept providing further isolation to the rejected signal through the addition of further quarter-wavelength grounding stubs;

FIG. 6 illustrates an embodiment of the inventive concept wherein the bandpass is reduced in width of frequencies passed through the use of different quarter-wavelength coupling stubs; and FIG. 7 illustrates an embodiment of the invention wherein additional coupling elements are utilized to both narrow the filter bandwidth and increase the rejection of unwanted signal frequencies.

DETAILED DESCRIPTION

Figure 1:
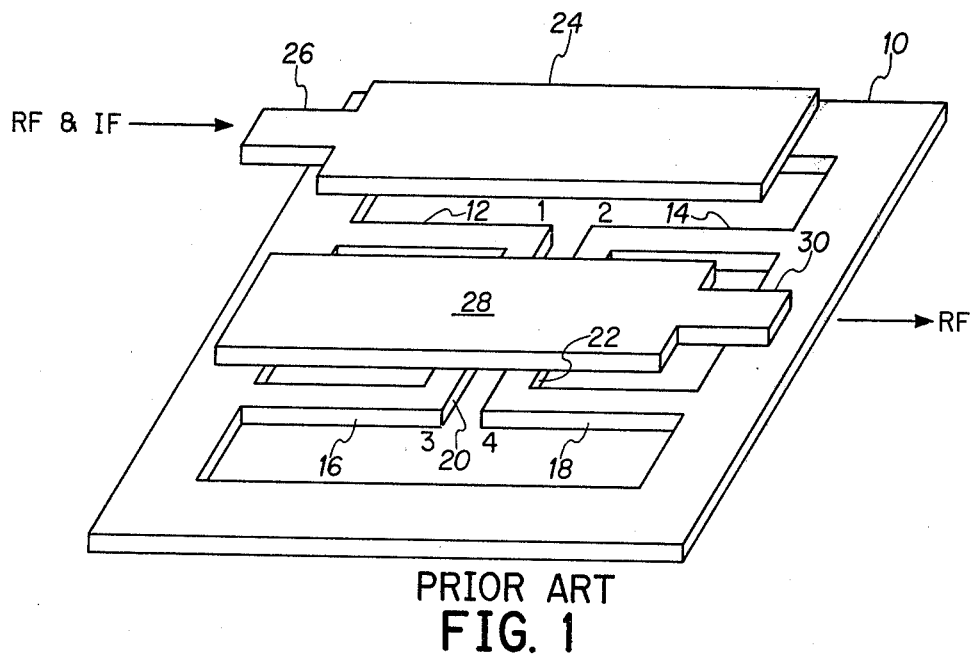
FIG. 1 is an isometric pictorial concept of a prior art concept.

In FIG. 1 a prior art device is illustrated with a ground plane 10 having a plurality of transmission paths 12, 14, 16 and 18 extending therefrom. Paths 12 and 16 are joined by a conductor 20 while paths 14 and 18 are joined by a conductor 22. The intersection of transmission path 12 and conductor 20 is additionally labeled with the numeral 1 and is adjacent a similar junction labeled 2 between transmission path 14 and conductor 22. As illustrated, the transmission paths 16 and 18 have similar points additionally labeled 3 and 4. Juxtaposed but spaced from the transmission paths 12 and 14 is a coacting transmission path 24 which has an input portion 26. Juxtaposed and spaced from transmission paths 16 and 18 is a further coacting transmission path 28 having a signal terminal 30.

While a practical embodiment of the isolation device contains a quantity of dielectric such as printed circuit board material between the transmission paths 24 and 28 and the remaining transmission paths and ground plane, the present illustration was utilized to provide a clearer understanding of the inventive concept.

FIG. 2 is substantially identical with that of FIG. 1 except that the ground planes between the two halves are separated so that there may be complete electrical isolation. Such electrical isolation can be very desirable in certain signal isolating techniques or procedures. While true transformers will provide true isolation, the inductive impedance problems involved with transformers prevents use at microwave frequencies.

In FIG. 2 a first transmission path or coupling line 75 receives input signals at a terminal 77 and coacts with transmission paths, coupling lines, or stubs 79 and 81 which are connected at far ends to a ground plane 83 and at near ends to junctions 1 and 2. A further transmission path or coupling line 85 has a signal terminal 87 and further coacts with transmission paths, stubs or coupling lines 89 and 90. These paths 89 and 90 are connected at opposite ends to a ground plane 91 and at near ends to terminals or junctions 3 and 4. Junctions 1 and 3 are connected via a conductive path 93 while terminals 2 and 4 are connected via a conductive path 95.

As before, the widths of the signal transmission coupling means or paths such as 75, relative the width of the stubs 79 and 81, comprise a design choice based on desired impedance, etc. While the "primary" transmission coupling means such as 75 are each shown larger than the "secondary" transmission coupling line means such as 79 and 81, specific applications of the invention may require or suggest that the width of the primary and secondary coupling elements be the same or even reverse in relative widths.

It should be noted that, for convenience the transmission coupling element such as 75, which is connected to the outside world, is referred to as "primary." The balanced output portion of the balun is referred to as "secondary" for the input balun. However, in discussing the output balun, the transmission coupling element 85, which is connected to the outside world, is referred to as a primary coupling means even though the signal is input at the balanced input comprising coupling elements 89 and 90.

It should also be noted that the separation of ground planes as illustrated in FIG. 2 does not provide direct current electrical separation of the grounds. Rather, it provides a separation of the AC grounds whereby the separate signal source and signal syncs can have their own ground reference points whereby each set of signals such as the combination RF and IF input and the single isolated RF output have amplitude values relative different grounds. Such a configuration as illustrated in FIG. 2 operates to eliminate ground current loops and reduce electrical grounding problems.

In FIG. 3, an input terminal 40 supplies signals to a primary winding 42 connected to ground 44. Input signals have to be referenced to ground and thus a second input terminal 46 is also connected to ground 44. The primary winding 42 acts through coupling means 48 to provide signals on a secondary winding 50 having ends 1 and 2 corresponding to those identical points in FIG. 1 and having a center tap connected to ground 44. As will be realized by those skilled in the art, equivalent circuits for planar baluns use parallel lines to group related windings and are not interpretable as an equivalence to an iron core transformer. Lead 1 of winding 50 is connected via a lead 52 to a lead 3 of a secondary winding 54. Lead 2 of winding 50 is connected via a lead 56 to lead 4 of winding 54. A ground 58 is illustrated connected to the center tap of winding 54. Winding 54 acts through coupling means 60 with winding 62 to provide an output between terminal 64 and terminal 66. Terminal 66 is connected to ground 58 as is the other end of winding 62.

If ground connections 58 and 44 are the same, this electrical schematic is representative of the electrical equivalent of FIG. 1 of the prior art as well as FIGS. 5 and 6. With the grounds separate as illustrated, it is representative of FIG. 2. As applied to FIG. 2, it will be realized that the ground 44 is representative of ground plane 83 in FIG. 2 while ground 58 is representative of ground plane 91 also in FIG. 2. The conductors 52 and 56 are representative of conductive elements 93 and 95 in FIG. 2 while input terminals 40 and 64 are represented by 77 and 87 respectively, in FIG. 2. Finally, the coupling means 48 and 60 would normally be considered the air spacing or dielectric spacing between the coupling elements such as between primary coupling element 75 and its associated secondary coupling elements 79 and 81.

FIG. 4 is a graph having the vertical or Y axis labeled in dB which is a logarithmic representation of power. The horizontal axis is also logarithmic and provides an indication of frequency. A first curve 35 illustrates the power attenuation characteristics of different frequency signals for the prior art device of FIG. 1. Curve 36 illustrates the same signal attenuation characteristics for FIG. 2 which is similar to FIG. 1 except that the ground plane is formed in two pieces and the distance between the primary transmission coupling elements 75 and 85 is substantially increased to reduce coupling therebetween. Curve 37 illustrates the embodiment of FIG. 5 which is substantially identical to that of FIG. 2 except for the addition of grounding stubs to even further attenuate the out-of-band frequencies such as IF frequency signals. In the design of the devices being tested, 5 gigahertz was to be an optimum coupling or design frequency and thus, minimal attenuation should occur at frequencies around this design frequency. Assuming that the IF frequency would be somewhere in the neighborhood of 70 megahertz, it will be noted that the embodiment of FIG. 5 had an increase of signal rejection at 70 megahertz of 42 dB over that provided by the prior art device of FIG. 1. As will be realized by those skilled in the art, a 42 dB increase in attenuation is equivalent to approximately 16,000 times the attenuation factor of the prior art device.

In FIG. 5 a ground plane 100 is illustrated having coupling stubs 102, 104, 106 and 108. Each of these stubs 102 through 108 are of a length which is substantially one-quarter the wavelength of the optimum coupling frequency of the RF signal. In addition to the coupling stubs there are further IF shunt or grounding stubs 110, 112, 114 and 116. These stubs 110 through 116 are also of a length equal to one-quarter of the wavelength of the RF frequency to be coupled from input to output. While these quarter-wavelength stubs appear as a very high impedance to the RF frequency due to the one-quarter wavelength design, they are substantially a ground to the IF frequency signals and thus operate in parallel with their attached stubs to even more effectively reject or eliminate signals of frequencies outside the desired bandpass. As indicated in the prior figures, the numerals 1 through 4 are used to illustrate the comparable points in the electrical equivalent schematic of FIG. 3. Transmission signal coupling means 118 couples RF signals to coupling stubs 106 and 108 while signals are coupled from stubs 102 and 104 to an output transmission line coupling means 120. The signals appearing at junctions 1 and 2 on the input balun are transmitted to the second balun by conductive paths 122 and 124. While it would be obvious to most anyone skilled in the art that the terminals of the transmission coupling lines such as 118 and 120 need not face in the opposite direction, FIG. 5 has been drawn in this configuration to further illustrate the point. It may also be noted that the conductors 122 and 124 are of a greater length relative to the quarter-wavelength stubs than in the prior figures. If the transmission lines 118 and 120 are close together, there is some coupling directly between the two transmission lines. This may be desirable in some cases and undesirable in other cases and such coupling is reduced substantially when these two transmission lines 118 and 120 are more than one-quarter wavelength apart.

It should be realized that while two sets of ground stubs are illustrated in FIG. 5, a set of ground stubs at either position illustrated will still provide improved performance over the total lack of ground stubs and further, the ground stubs can also be positioned intermediate the secondary coupling stubs somewhere in the vicinity of the designators 122 and 124. Further, although grounding stubs are only illustrated in connection with FIG. 5, they are completely applicable to each of the other FIGS. 2, 6 and 7. Also, although a preferred embodiment would normally have the length of these stubs be one-quarter the wavelength of the design frequency for the device (RF), the length can be such that it is one-quarter the wavelength of almost any frequency within the bandpass region and still operate with high effectiveness.

FIG. 6 illustrates a further dual balun embodiment having a ground plane 130, having transmission line elements 132 and 134 which couple respectively to stubs 136, 138, 140 and 142. Using the same symbology as before, a conductor 144 connects quarter-wavelength coupling stubs 136 to 140 while a conductor strip 146 connects quarter-wavelength coupling stub 138 to quarter-wavelength stub 142. As clearly illustrated by the cutout in transmission element 134, the ground plane is altered for the balun utilizing transmission element 134 as compared to the balun using transmission element 132. In other words, the frequency of optimum or maximum coupling for the input balun is slightly lower than that of the output balun since the output balun has shorter stubs 140 and 142. Although the embodiment of FIG. 6 illustrates the balun having transmission element 132 as being the input, the concept will work equally well in most applications with the signals being input to transmission element 134 and output from the lower frequency coupled balun.

In FIG. 7 a ground plane 150 is illustrated having different widths at various points. A first transmission coupling means 152 receives RF and IF input signals while a second transmission element 154 outputs RF signals after the balun has rejected substantially all of the signals outside the desired bandpath including the IF signals. Extending from the ground plane 150 are a plurality of stubs 156, 158, 160, 162, 164, 166, 168 and 170. The stubs 156 and 158 are of the same length and utilize the previously presented designations 1 and 2 at the intersection thereof. Element or stub 156 is connected to stub 160 via conductor 172 at a junction additionally labeled 5. A conductor 174 connects junction 1 of stub 158 with stub 162 at a junction additionally designated as 6. A conductor 176 connects stub 164 at a junction 7 to junction 4 of stub 168. A conductor 178 connects a junction 8 of stub 166 with junction 3 of stub 170. As may be observed by those skilled in the art, the three sets of quarter-wavelength stubs are each somewhat different in length but are all nearly the length of the stubs 156 and 158 which are at the quarter-wavelength frequency of the RF signal to be passed. The coupling stubs 160 through 166 achieve maximum coupling at a slightly higher frequency so as to increase the attenuation slope of the low frequency side of the bandpass filter characteristic while the stubs 168 and 170 provide maximum coupling at a frequency lower than the RF frequency so as to increase the attenuation slope of the high side attenuation characteristic of the bandpass curve. In addition, the three couplers in series may be designed to decrease the total width of the bandpass portion of the bandpass filter and thus provide a better bandpass band rejection characteristic for critical situations.

As will be realized, for the different length coupling elements of FIGS. 6 and 7, normally one of the coupling elements will have an integral relationship to the design frequency. In other words, the stubs will either be one-quarter the length of the design frequency or the main primary coupling element will be one-half the length of the design frequency. However, a specific attenuation characteristic may dictate that none of these be exactly one-quarter the design frequency for the purpose of improving the attenuation characteristics over the bandpass range of frequencies. For the purposes of the claims, the term "near" as related to frequency is to be interpreted as not only meaning approximately the same frequency but also including identical frequency.

While not illustrated, the equivalent circuit for FIG. 7 would be quite similar to that illustrated in FIG. 3 except that the leads 52 and 56 would be replaced by a 1 to 1 transformer having center tapped primary and secondary windings wherein the center taps are connected to ground with the center tapped intermediate transformer representing the coupling elements comprising 160–166.

OPERATION

As is known to those skilled in the art, a balun is a term used as an abbreviation for a "balanced to unbalanced" signal converter or vice versa. The device of FIG. 1, comprising a part of the referenced co-pending application has been used to pass RF frequencies in the neighborhood of 5 gigahertz while rejecting IF signals below 1 megahertz. A specific embodiment had IF signals at 70 megahertz and operated as an isolation device with greatly improved properties over its prior art apparatus. The present concept illustrates configurations resulting from a greater understanding of the operation of FIG. 1 and provides greatly improved performance specifications over the apparatus of FIG. 1.

The present device is usable either as a bandpass filter or as an isolation device in conjunction with a signal frequency converter. As an isolation device, any low frequency signals (as used herein IF) which are applied to terminal 77 effectively "see" a nearly open circuit. This open circuit presents a high IF frequency signal shunt impedance to ground and a high series circuit impedance and thus minimizes IF frequency signal loss from a source such as the signal frequency converter (mixer) and enhances the efficiency of the mixer circuit.

It is very often desirable to have complete electrical isolation between a signal source and a signal sync. It was thus determined that the configuration of FIG. 1 could be altered as illustrated in FIG. 2 to have complete isolation to low frequency band rejected signals as well as high frequency bandpass signals. When using the configuration of the invention utilized by the prior art in FIG. 1, in terms of sizes of the primary transmission coupling elements 75 and 85, the distance therebetween and the size and structure of the secondary coupling elements such as 79, 81, 89 and 90, it has been ascertained that the signal rejection characteristics and signal bandpass characteristics are substantially identical with that of the prior art.

It has further been determined that by increasing the distance between the coupling elements as illustrated in FIG. 5, even further improvement in signal attenuation at the low frequencies is obtained. Curve 36 of FIG. 4 represents the signal frequency attenuation characteristics for a device such as that shown in FIG. 5 when the grounding elements or stubs 110, 112, 114 and 116 are deleted. By inserting these stubs 110–116 as illustrated, even greater attenuation characteristics are obtained as presented in curve 37 of FIG. 4. These stubs 110–116 provide an additional grounding characteristic to "bleed off" any IF signals or band rejected signals from being coupled from the first balun to the second balun. These operate on the basis that they present a substantially infinite impedance (about one-quarter wavelength) to signals at the bandpass frequency and yet provide a very low impedance to band reject frequency signals.

FIG. 5 also illustrates that the terminals may be on the same side of the device if so desired rather than on opposite sides as was illustrated for FIG. 2.

While the remaining devices are illustrated as having the main transmission elements situated close together, this presentation in the other devices is provided mainly as an illustrative convenience and is not necessarily intended to imply that the remaining designs operate in their best mode with substantial coupling between the main transmission elements.

As may be noted, FIG. 6 illustrates that the ground plane is different widths at different points. Further, the length of the primary transmission coupling elements 132 and 134 are different as are the coupling stubs 140 and 142 as compared to the coupling stubs 136 and 138. By altering the length of the stubs and the primary coupling elements, the bandpass and band reject characteristics of the device can be further improved. Thus, the optimum coupling frequency of the two baluns can be designed to be on either side of the frequency to be passed or can be designed to have one of the baluns have optimum coupling at the design bandpass frequency and have the other one slightly offset from that frequency to improve the characteristics of the bandpass filter.

These frequency attenuation characteristics of the filter can be even further improved upon or the bandpass width of the filter can be improved for specific application by using additional coupling elements such as those provided by elements 160–166 of FIG. 7 as illustrated. Although each of the coupling elements (the baluns and the central coupling elements) of FIG. 7 are near the optimum coupling or design frequency of the isolation device, each would be somewhat different to optimize the bandpass characteristics.

Although from hindsight the variations of the inventive concept as shown in FIGS. 2 and 5–7 are similar to that of the prior art of FIG. 1, it should be realized that a great deal of testing, analysis and discussion occurred before the configurations providing the greatly improved bandpass frequency characteristics resulted as presented by the present application for patent.

Therefore, we wish to be limited not by the specific embodiments illustrated, but only by the scope of the appended claims wherein we claim:

1. Signal isolation apparatus for isolating first frequency $f_1$ signals from second frequency $f_2$ signals comprising, in combination:
   ground plane means;
   first and second ($f_2$ wavelength)/4 stubs extending from said ground plane means toward a first common area;
   third and fourth ($f_2$ wavelength)/4 stubs extending from said ground plane means toward a second common area wherein said first common area and said second common area are separated by a distance of at least ($f_2$ wavelength)/4;
   input signal transmission line means juxtaposed but separated from said first and second stubs; and
   output signal transmission line means juxtaposed but separated from said third and fourth stubs.

2. Signal isolation apparatus for isolating $f_1$ frequency signals from $f_2$ frequency signals where both frequency signals are combined at an input comprising, in combination:
   ground plane means;
   first and second stub means extending from said ground plane means toward a first common area;
   third and fourth stub means extending from said ground plane means toward a second common area, said first and second stub means being different in length from said third and fourth stub means but each of said stub means being configured to be substantially the length represented by ($f_2$ wavelength)/4;
   first signal transmission means juxtaposed but separated from said first and second stub means;
   means for supplying $f_1$ and $f_2$ frequency signals between said first signal transmission means and said ground plane means;
   second signal transmission means juxtaposed but separated from said third and fourth stub means;
   means electrically connecting said first stub means in said first common area to said third stub means in said second common area;
   means electrically connecting said second stub means in said first common area to said fourth stub means in said second common area; and
   means for outputting $f_2$ signals between said second signal transmission means and said ground plane means.

3. The method of isolating $f_1$ frequency signals from a combination of $f_1$ and $f_2$ frequency signals comprising, the steps of:
   applying $f_1$ and $f_2$ frequency signals to a first balun having optimum coupling between input and output thereof at a frequency $f_3$ near $f_2$; and
   passing signals output by said first balun through a second balun having optimum coupling at a frequency $f_4$ near $f_2$ where $f_3$ and $f_4$ are different frequencies.

4. The method of isolating signals comprising the method of claim 3 with the additional step of:
   passing the signals which are output by the first balun through further signal coupling means for providing further isolating action before inputting the signals to said second balun.

5. Apparatus for isolating $f_1$ frequency signals from a combination of $f_1$ and $f_2$ frequency signals comprising, in combination:
   first balun means, including input means and output means, having optimum coupling between said input means and said output means thereof at a frequency $f_3$ near frequency $f_2$;
   signal means, connected to said input means of said first balun means, for supplying $f_1$ and $f_2$ frequency signals to said first balun means;
   second balun means, including input means and output means, having optimum coupling between said input means thereof and said output means thereof at a frequency $f_4$ near frequency $f_2$;
   connection means, connected between said output means of said first balun means and said input means of said second balun means for transferring signals therebetween; and
   said output means of said second balun means supplying output signals wherein the attenuation of $f_2$ frequency signals is relatively insignificant as compared to the attenuation of $f_1$ frequency signals.

6. Apparatus as claimed in claim 5 wherein:
   said connection means includes further isolating coupling means wherein optimum coupling occurs at a frequency near $f_2$.

7. Apparatus as claimed in claim 5 wherein $f_3$ and $f_4$ represent identical frequencies and including, in addition:
   grounding stub means connected to said output means of said first balun means wherein said grounding stub means are substantially equal in length to one-quarter of the wavelength of frequency $f_2$.

8. Bandpass filter apparatus comprising, in combination:
   unbalanced to balanced first signal translation means for passing only a band of signal frequencies;
   balanced to unbalanced second signal translation means for passing only said band of signal frequencies;
   input means for applying signals both in the bandpass frequency and the band reject frequency to the unbalanced portion of said first signal translation means;
   conductive means connecting the balanced portions of said first and second signal translation means together; and
   grounding stub means, electrically equivalent to one-quarter the wavelength of signal frequencies in the band of signal frequencies to be passed, connected to said conductive means.

9. Series circuit filtering apparatus for passing a band $\Delta f$ frequency signals and attenuating passage of other frequency signals comprising, in combination:
   first balun means including input means and output means and having a first optimum coupling frequency $f_1$ within said band $\Delta f$;
   second balun means including input means and output means and having a second optimum coupling frequency $f_2$ within said band $\Delta f$; and
   means connecting said output means of said first balun means to said input means of said second balun means.

10. Signal isolation apparatus for passing a range of frequencies $\Delta f$ with minimal attenuation while significantly attenuating signal frequencies outside said range comprising, in combination:
    input signal balun means including first and second signal transmission coupling means;
    output signal balun means including first and second signal transmission coupling means; and
    means, including grounding stub means, connecting said second signal transmission coupling means of said input balun means to said second signal transmission coupling means of said output balun means.

11. Apparatus as claimed in claim 10 wherein:
    one of said first and second transmission coupling means is electrically equivalent to one-quarter the wave-length of a frequency within said $\Delta f$ range; and
    the other of said first and second signal transmission coupling means is electrically equivalent to one-half the wavelength of a frequency within said $\Delta f$ range.

12. Signal isolation apparatus for passing a range of frequencies $\Delta f$ with minimal attenuation while significantly attenuating signal frequencies outside said range comprising, in combination:
    input signal balun means including first and second signal transmission coupling means;
    first ground plane means connected to said second signal transmission coupling means;
    output signal balun means including first and second signal transmission coupling means;
    second ground plane means, electrically separated from said first ground plane means at the operating frequencies, connected to said second signal transmission coupling means of said output signal balun means; and
    means connecting said second signal transmission coupling means of said input balun to said second signal transmission coupling means of said output balun means.

* * * * *